(12) United States Patent
Hissink et al.

(10) Patent No.: US 9,385,670 B2
(45) Date of Patent: Jul. 5, 2016

(54) DUAL BRIDGE AMPLIFIER CONFIGURATION

(71) Applicant: NXP B.V., Eindhoven (NL)

(72) Inventors: Derk Jan Hissink, Schalkhaar (NL); Max Martin, Wijchen (NL); Fred Mostert, Horssen (NL)

(73) Assignee: NXP B.V., Eindhoven (NL)

(*) Notice: Subject to any disclaimer, the term of this patent is extended or adjusted under 35 U.S.C. 154(b) by 151 days.

(21) Appl. No.: 14/268,135

(22) Filed: May 2, 2014

(65) Prior Publication Data

US 2014/0334647 A1   Nov. 13, 2014

(30) Foreign Application Priority Data

May 8, 2013   (EP) .................................. 13167116

(51) Int. Cl.
| H03F 1/14 | (2006.01) |
| H03F 3/217 | (2006.01) |
| H03F 3/68 | (2006.01) |
| H03F 3/185 | (2006.01) |
| H03F 3/45 | (2006.01) |
| H04R 1/00 | (2006.01) |
| H03F 1/52 | (2006.01) |
| H03F 3/187 | (2006.01) |

(52) U.S. Cl.
CPC ............... *H03F 3/2173* (2013.01); *H03F 1/52* (2013.01); *H03F 3/185* (2013.01); *H03F 3/187* (2013.01); *H03F 3/45179* (2013.01); *H03F 3/45475* (2013.01); *H03F 3/68* (2013.01); *H04R 1/00* (2013.01); *H03F 2200/03* (2013.01); *H03F 2200/33* (2013.01); *H03F 2203/21136* (2013.01); *H03F 2203/45171* (2013.01)

(58) Field of Classification Search
CPC ..... H03F 3/68; H03F 2200/03; H03F 3/2173; H03F 1/0277
USPC .......... 381/120, 28; 330/10, 251, 51, 146, 69
See application file for complete search history.

(56) References Cited

U.S. PATENT DOCUMENTS

| 5,444,417 | A |   | 8/1995 | Botti et al. |
| 5,654,668 | A | * | 8/1997 | Botti ...................... H03F 3/3081 330/146 |
| 5,708,390 | A |   | 1/1998 | Dunnebacke |
| 5,729,174 | A | * | 3/1998 | Dunnebacke ............. H03F 3/68 330/124 R |
| 7,167,047 | B2 | * | 1/2007 | Botti ...................... H03F 1/0277 330/207 A |
| 7,230,482 | B2 | * | 6/2007 | Chelli ................... H03F 1/0277 330/146 |

(Continued)

FOREIGN PATENT DOCUMENTS

| EP | 0 753 935 A1 | 1/1997 |
| EP | 0 753 936 A1 | 1/1997 |

(Continued)

OTHER PUBLICATIONS

Extended European Search Report for application No. 13167116.6 (Oct. 17, 2013).

*Primary Examiner* — Disler Paul (57) ABSTRACT

An amplifier has a dual bridge design with two bridge amplifiers. A mode switch enables them to be configured in a series amplification mode. The switching of the mode switch is dynamic and enables re-use of signal current thereby improving overall system efficiency. A delay to the mode switch closure is provided in the event of clipping of one of the amplifier outputs. This prevents large cross currents from flowing.

15 Claims, 9 Drawing Sheets

(56) References Cited

U.S. PATENT DOCUMENTS 8,330,539 B2 * 12/2012 Hissink ............... H03F 1/0277 330/146
2011/0123040 A1 * 5/2011 Hissink ............... H03F 1/0277 381/86

FOREIGN PATENT DOCUMENTS

| EP | 1 496 611 A1 | 1/2005 |
| EP | 1 548 933 A1 | 6/2005 |
| EP | 2 284 993 A2 | 2/2011 |

* cited by examiner

DUAL BRIDGE AMPLIFIER CONFIGURATION

CROSS-REFERENCE TO RELATED APPLICATIONS

This application claims the priority under 35 U.S.C. §119 of European patent application no. 13167116.6, filed on May 8, 2013, the contents of which are incorporated by reference herein.

This invention relates to a dual bridge amplifier configuration, which has recently been termed a Class-SB amplifier.

The concept of a Class-SB amplifier is disclosed in US 2011/0123040.

The amplifier is a dual bridge design with two bridge amplifiers. A mode switch enables them to be configured in a series amplification mode. The switching of the mode switch is dynamic and enables re-use of signal current thereby improving overall system efficiency. Each amplifier is associated with its own load.

When the amplitudes over the connected loads are such that they can be accommodated with the supply voltage, the system is in Class-SB operation mode and the mode switch is closed. With the switch closed, current can be shared between the two bridge tied load ("BTL") amplifiers, thereby increasing system efficiency.

When the mode switch is open, the two amplifiers operate as separate independent amplifiers. This can be considered to be a bridge tied load mode of operation, with the load (speaker) connected between two output stages.

A problem can arise in the circuit that during dipping conditions, the amplifier operates in the bridge tied load mode and the outputs of the two circuit halves are at supply or ground and the switch is open. When the input voltages change, the outputs introduce a certain delay.

In particular, when the transistors in the output stage have to be switched from the on to off settings, this costs time. The time depends on how fast the gate-source voltage can transition from Vgs,max to below the turn-on voltage. When the amplifier is non-clipping and in regulation, the gate-source voltages of the output transistors are driven up to a certain extent but not to the full maximum (Vgs,max).

When an amplifier is clipping, the loop is out of regulation (i.e. the amplifier does not satisfy Vout=Gain*Vin) and will drive the gate-source voltages to the maximum Vgs,max. Due to this, recovering from a clipping condition takes more time since reducing the gate-source voltage to below the turn-on threshold of the power device takes longer.

The current sharing switch, connecting the two bridges, is opened and closed based on the magnitude of the input voltage and the available supply voltage.

The invention is defined by the claims.

According to the invention, there is provided an amplifier comprising:

a first bridge amplifier section having two differential amplifiers with a first load connected between their outputs;

a second bridge amplifier section having two differential amplifiers with a second load connected between their outputs;

a mode switch between a first output of one differential amplifier of the first bridge amplifier section and a second output of one differential amplifier of the second bridge amplifier section;

a control circuit for controlling the mode switch based on the input signals to the first and second bridge amplifier sections;

a clip detection arrangement for detecting clipping in the first or second outputs; and a delay for providing a delay period from when the clipping is detected, wherein the control circuit inhibits closing of the mode switch during the delay period.

The invention thus provides a dual bridge amplifier with selective coupling of outputs of the two bridges. The closing of the mode switch, to switch to a series amplification configuration, is prevented for a period of time after clipping is detected at the outputs of either of the bridge amplifiers. In this way, large currents in the system can be prevented which can otherwise arise when a feed-forward control system is used.

The invention enables prevention of large cross currents, running through the switch connecting two or more bridge tied load ("BTL") bridges, in a Class-SB based system during clipping output signal conditions. This prevents the occurrence of audio-holes and greatly improves system robustness.

The amplifier can comprise an audio amplifier.

A first current source tail can be provided for the first bridge amplifier section and a second current source tail can be provided for the second bridge amplifier section.

An amplifier can also be used which detects currents of an output differential amplifier of the first bridge amplifier section and an output differential amplifier of the second bridge amplifier for generating output currents which force the output differential amplifier output currents to flow in the same direction.

The invention also provides a method of controlling an amplifier, the amplifier comprising:

a first bridge amplifier section having two differential amplifiers with a first load connected between their outputs;

a second bridge amplifier section having two differential amplifiers with a second load connected between their outputs; and a mode switch between a first output of one differential amplifier of the first bridge amplifier section and a second output of one differential amplifier of the second bridge amplifier section, wherein the method comprises:

controlling the mode switch based on the input signals to the first and second bridge amplifier sections;

detecting clipping in the first or second outputs; and inhibiting closing of the mode switch during a delay period from when the clipping is detected.

An example of the invention will now be described in detail with reference to the accompanying drawings, in which.

The invention provides a modification to the circuit presented in US 2011/0123040. The invention provides a delay to the mode switch closure in the event of dipping of one of the amplifier outputs. This prevents large cross currents from flowing. For completeness, the known circuit operation will first be described.

Figure 1:
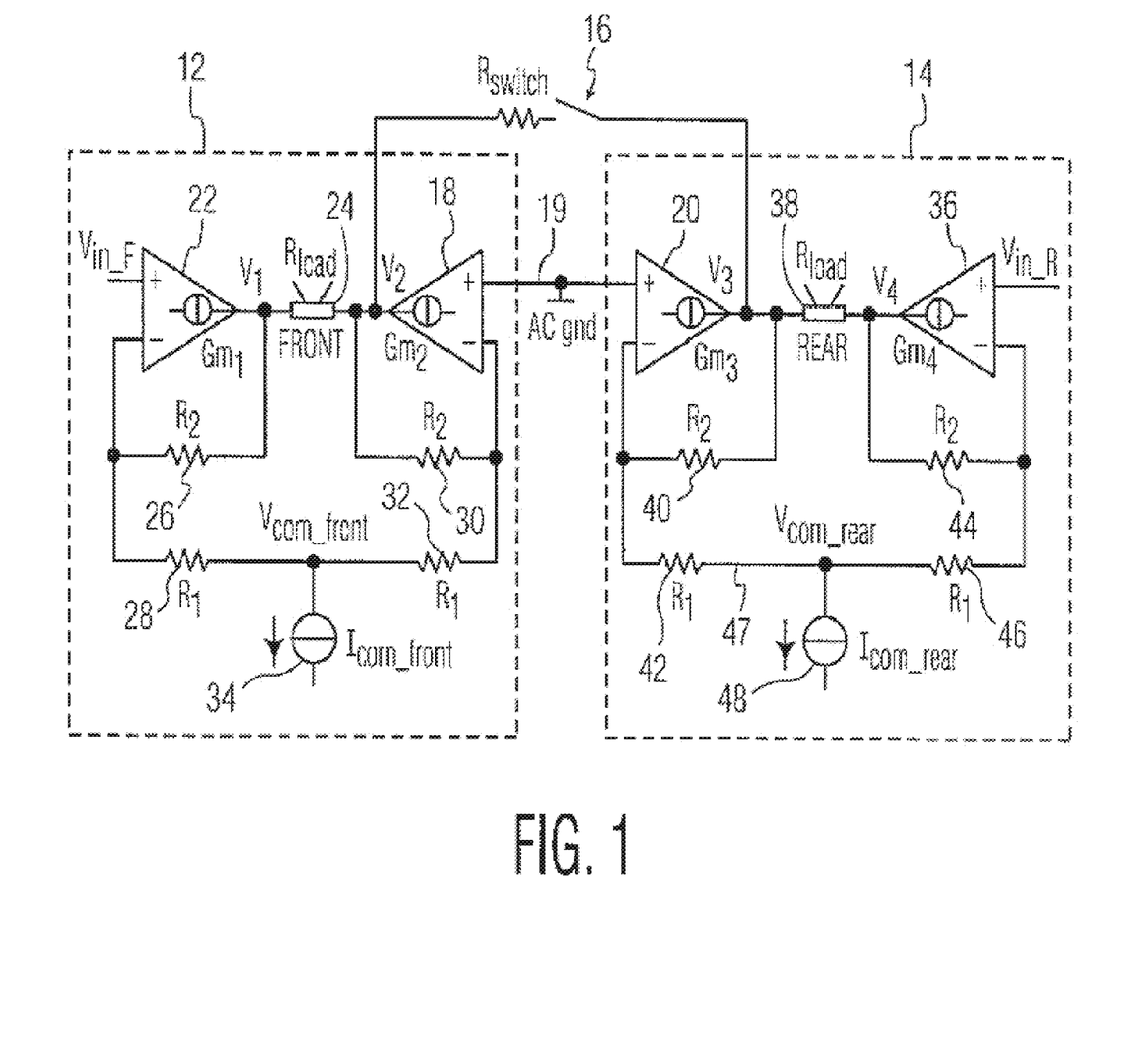
FIG. 1 shows a known functional block schematic of an example partial model of a dual bridge class SB amplifier.

FIG. 1 shows a functional block schematic of partial model of the known dual bridge class SB amplifier. FIG. 1 is termed a "partial model" because it omits a particular compensation current generator by assuming that the switch 16 resistance is zero. At FIG. 3, an example of dual bridge class SB amplifier having an example implementation of the compensation current generator omitted from the FIG. 1 partial model is described.

The partial model is assumed to receive a system power having a Vdd voltage. The absolute value of Vdd is not particular to the embodiments. Vdd may for example be +12 volts DC.

The model includes a first bridge amplifier 12 and a second bridge amplifier 14, switchably connected to one another by a mode switch 16. The various criteria and definitions of conditions on which the mode switch 16 is controlled, i.e., opened and closed, are described in greater detail below. Circuitry for generating the signal(s) controlling the mode switch 16 is omitted from FIG. 1 because, upon reading the various criteria and conditions on which the mode switch 16 may be controlled, i.e., opened and closed, a person of ordinary skill in the art may readily design and construct a circuit performing the switch control function(s), applying only conventional engineering design knowledge to the present disclosure.

Figure 3:
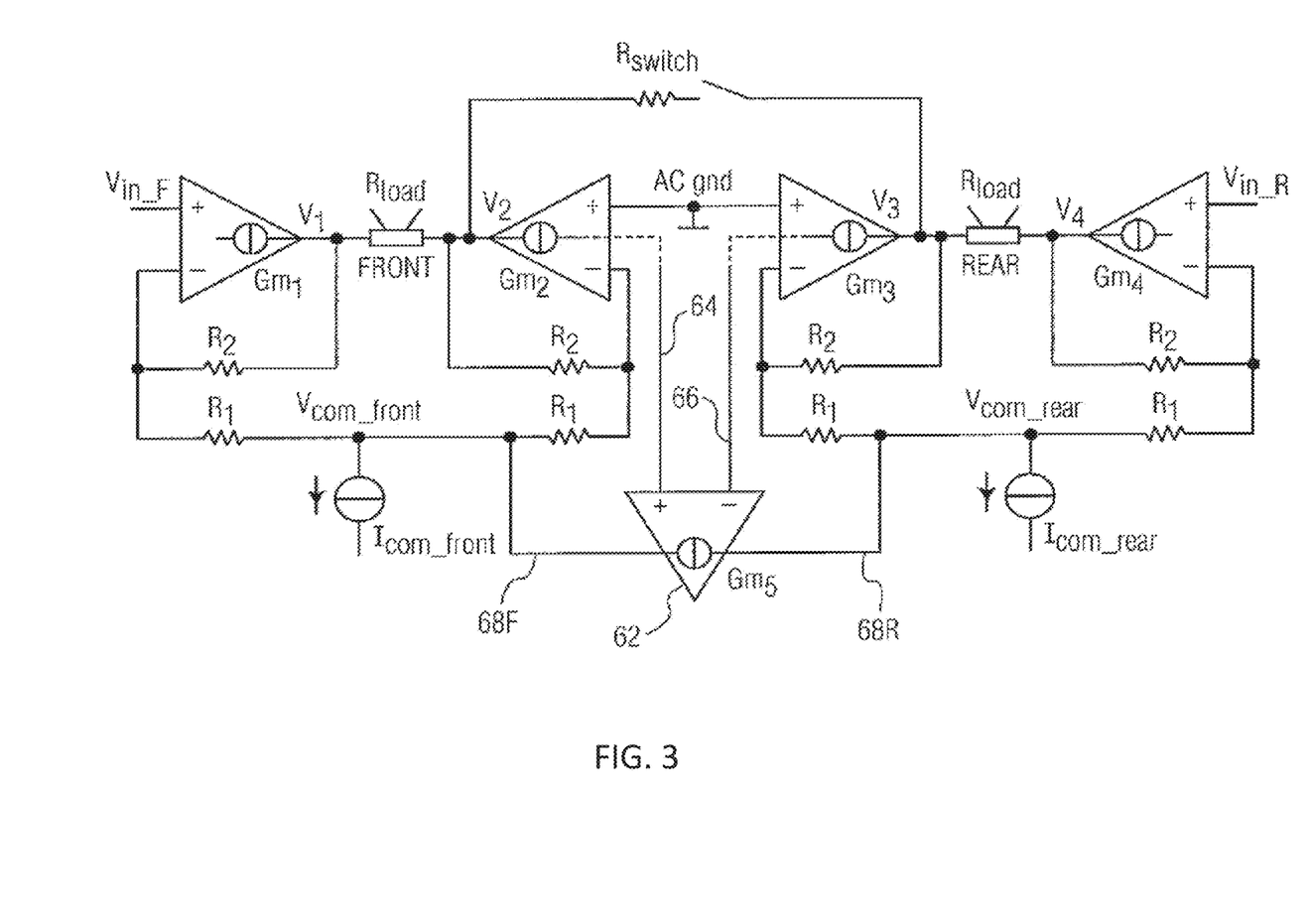
FIG. 3 shows one example known dual bridge switched SB amplifier.

FIG. 1 relates to an example environment having four speakers such as, for example, a front left, a rear left, a front right and a rear right speaker. The example of FIG. 1 in a complete embodiment such as depicted at FIG. 3 may, for example, drive the left front ("FRONT") and left rear ("REAR") speakers of such a four-speaker example. Consistent with such an example environment, the first bridge amplifier 12 will be referenced hereinafter as the "front" bridge amplifier 12, and the second bridge amplifier 14 will be referenced as the "rear" bridge amplifier 14.

With continuing reference to FIG. 1, the front bridge amplifier 12 and the rear bridge amplifier may, but are not necessarily, structurally identical. The front bridge amplifier 12 includes a pair of differential amplifiers 18 and 22, the amplifier 18 termed an "inner" differential amplifier 18 and the amplifier 22 termed an "outer" differential amplifier 22. The output V1 of the outer differential amplifier 22 connects to one terminal of a front speaker 24. In a like manner, the output V2 of the inner differential amplifier 18 connects to the other terminal of the front speaker 24. The voltage at the output of the outer differential amplifier 22 is arbitrarily labelled "V1," and the voltage at the output of the inner differential amplifier 18 is arbitrarily labelled "V2" for purposes of reference in further detailed description.

The outer differential amplifier 22 has a "+" terminal and a "−" terminal. The "+" terminal receives an externally generated signal, arbitrarily labelled as Vin_F, which may, for example, be a front fader/splitter (not shown in FIG. 1) portion of a left channel of a two-channel stereo system (not shown in FIG. 1). The Vin_F may, for example, be the above-described example Audio_Front(t). In such an example, the other externally generated signal, Vin_R, shown as connected to the "+" input terminal of the outer differential amplifier 36 of the rear bridge amplifier 14, may be an inverted version of Vin_F, i.e., the counterphase of Vin_F The Vin_R signal may, for example, be the above-described example Audio_Rear(t) signal. Vin_F and Vin_R may or may not have the same magnitude, depending on the setting of, for example, a front-to-rear volume fader. Vin_F and Vin_R, however, are not necessarily counterphases of the same signal. On the contrary, unless Vin_F and Vin_R are identical to one another in phase and magnitude, dual mode class SB amplifiers, according to the various exemplary embodiments, will provide statistical improvement in the power efficiency.

Referring to FIG. 1, the "+" input of amplifier 18 is connected, via connection 19, to the "+" input of the inner differential amplifier 20 of the second, or rear bridge amplifier 14. As shown at FIG. 1, the connection 19 is termed "AC gnd", for reasons that will be readily apparent in view of further detailed descriptions at later sections. The "−" input terminal of the inner differential amplifier 18 is connected via feedback resistor 30 to the output of the amplifier and connected, via another feedback resistor 32, to the common node 33. As can be understood by persons skilled in the art, the resistors 30 and 32 form a feedback circuit to control the output voltage, labelled V2, of the inner differential amplifier 18.

Likewise, the output of the outer differential amplifier 22 connects via feedback resistor 26 to the "−" input of the amplifier 22, and the "−" terminal also connects, through resistor 28, to the common node 33. The resistors 26 and 28 therefore form a feedback resistance circuit for the outer differential amplifier 22, and their ratio sets the V2/Vin_F gain.

FIG. 1 shows resistor 26 as having an "R2" value and shows resistor 28 having an "R1" value. For purposes of description R2 may be assumed equal to R1 which sets the gain of the outer differential amplifier 22, with respect to the Vin_F input, as V2=(1+R2/R1)=2. Likewise, the R2 value of the resistor 30 may be assumed equal to the R1 value of the resistor 32. The absolute resistance values R1 and R2, i.e., the absolute resistance value of resistors 26, 28, 30, and 32 (as well as the corresponding resistors 40, 42, 44, and 46 of the rear bridge amplifier 14) are not particular to the present embodiments. Such values may be readily determined by applying conventional amplifier design methods.

A front bridge amplifier compensation current source 34 connects to the common node 33, and is configured to feed or sink a current Icom_front to, or from, the common node 33, based on one or the other of Vin_F and Vin_R.

According to one embodiment, a "fixed common node voltage" embodiment, Icom_front is based on Vin_F and, likewise, the Icom_rear current fed or sunk by the rear bridge compensation circuit 48 is based on Vin_R. A result of dual mode class SB amplifiers having the front and rear bridge compensation circuits 34 and 48 configured according to this aspect maintain the voltage Vcom_front at the front common node 33 equal to the voltage Vcom_rear at the rear common node 47 of the rear bridge amplifier 14.

The fixed common node voltage embodiments thereby maintain V2=V3. V2 and V3 are maintained equal to Vdd/2, which is the ACgnd voltage at the connection 19 between the "+" input terminal of the inner differential amplifier 18 of the front bridge amplifier 12 and the "+" input terminal of the inner differential amplifier 20 of the rear bridge amplifier 14. The fixed common node voltage embodiments also control the mode switch 16 to open, and thereby switch the dual mode class SB amplifier to the separate amplification mode, when either Vin_F (after being amplified to V1) exceeds Vdd/2, or Vin_R (after being amplified to V4 at the output of the outer differential amplifier 36 of the rear bridge amplifier 14) exceeds Vdd/2.

According to other exemplary embodiments, termed "adaptive common node voltage" embodiments, the front bridge amplifier compensation current source 34 connected to the front common node 33 sources or sinks, a current Icom_front that is based on the Vin_R signal. Likewise, the rear bridge amplifier compensation current source 48 connected to the rear common node 47 sources or sinks a current Icom_rear that is based on Vin_F. A result of the Icom_front and Icom_rear currents being generated in this manner is that V2 is set equal to V3, but at a common voltage that is the average of Vin_F and Vin_R, hence the name "adaptive common node voltage".

The rear bridge amplifier 14 is configured identically to the front bridge amplifier 12. More particularly, the output terminal V3 of the inner differential amplifier 20 connects to one terminal of the second load 28. The other terminal of the second load 38 connects to the output terminal V4 of the outer differential amplifier 36. Resistors 40 and 42 form a feedback circuit for the inner differential amplifier 20, connecting the output of the inner differential amplifier 20 to the "−" input of that amplifier 20 and to the common node 47. Resistors 44 and 46 form a feedback circuit connecting the output of the outer differential amplifier 36 to the "−" input terminal of that amplifier 36 and to the common node 47. Similar to the previously described front bridge amplifier compensation current source 34 connecting to the common node 33 of the front bridge amplifier 12, a rear bridge amplifier compensation circuit 48 connects to the common node 47 and is configured to feed or sink a current, Icom_rear, based on one or the other of Vin_F and Vin_R. Further, the given drive signal Vin_R is input to the "+" terminal of the outer differential amplifier 36.

Various example aspects of the front and rear bridge amplifier compensation circuits 34 and 48 will now be described, together with relevant operations of the mode switch 16.

In overview, the purpose of the front and rear bridge amplifier compensation circuits 34 and 48 goal is to keep V2 and V3 constant and equal to each other when the mode switch 16 is closed, placing the front and rear bridge amplifiers 12, 14 in series. In actual implementations, the only difference between V2 and V3 is the voltage over the mode switch 16, which is caused by the current passing from the output of the inner differential amplifier 18 of the front bridge amplifier 12 to the output of the inner differential amplifier 20 of the rear bridge amplifier 14, or vice versa, multiplied by Rswitch.

Ideally, Rswitch should be zero and, for purposes of assisting in focusing the description on the novel aspects of the embodiments, an ideal switch 16 will be assumed.

Referring to FIG. 1, the front bridge amplifier compensation circuit 34 and the rear bridge amplifier compensation circuit 48 may be configured to apply the currents Icom_front and Icom_rear, respectively, to the front common node 33 and the rear common node 47:

$$\text{Icom\_front} = \frac{\text{Vin\_f}}{R1}, \quad \text{(Eqn. 1)}$$

assuming the resistance of resistor 28 is $R1$ $$\text{Icom\_rear} = \frac{\text{Vin\_R}}{R1}, \quad \text{(Eqn. 2)}$$

assuming the resistance of resistor 46 is $R1$

The result is that V2 and V3 are constant and equal to AC ground. The entire input voltage Vin_F is across the R1 resistance of resistor 28, and the entire input voltage Vin_R is across the same R1 resistance of resistor 46. The common output voltage of the amplifiers (virtual mid-tap of the speaker) varies with half the output voltage.

When V1 reaches its maximum value (½Vdd), hereinafter referred to as Vin_max, the mode switch 16 must be opened, because the front and rear amplifiers 12, 14 cannot be switched in series anymore and V2 and V3 will become unequal. Now the common output voltage has to go back to AC ground. This can be achieved by controlling the front bridge amplifier compensation circuit 34 and the rear bridge amplifier compensation circuit 48 to apply the currents Icom_front and Icom_rear, after the absolute value of Vin_F or Vin_R hit Vmax and the switch 16 is opened and the dual mode class SB amplifier is switched to its separate amplification mode, based on the current, as follows:

$$\text{Icom\_front} = \frac{\text{Vin\_max} - \text{Vin\_F}}{R1} \quad \text{(Eqn. 3)}$$

$$\text{Icom\_rear} = \frac{\text{Vin\_max} - \text{Vin\_R}}{R1} \quad \text{(Eqn. 4)}$$

As can be seen from Eqn. Nos. 1-4, as long as both of Vin_F and Vin_R are within Vmax/2, the Icom_front and Icom_rear increase and decrease in direct proportion to Vin_F and Vin_R, respectively. When either of Vin_F or Vin_R exceeds Vmax/2, the corresponding common current Icom_front and/or Icom_rear starts to decrease, which means there is substantially no discontinuity in the common output voltage.

Figure 2:
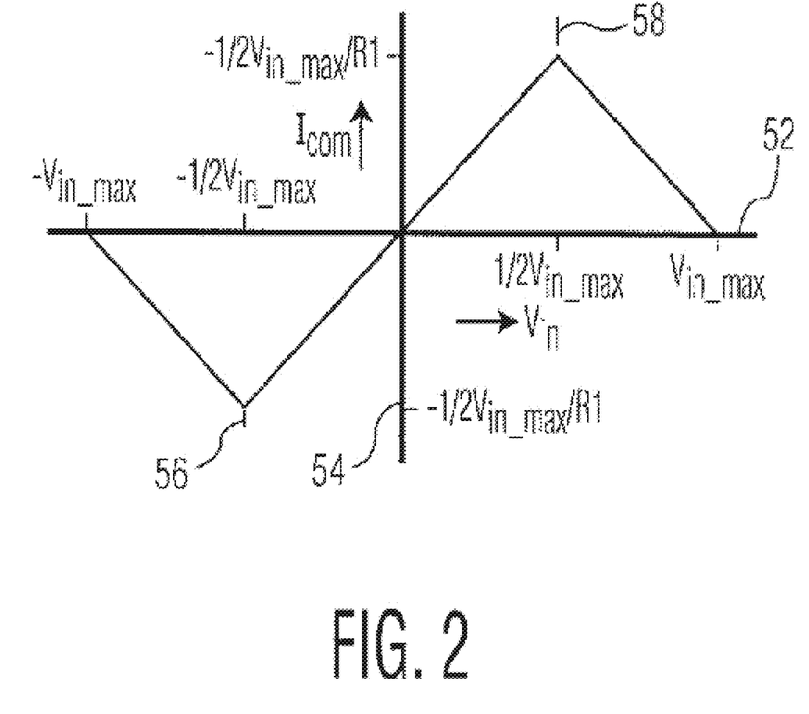
FIG. 2 shows an example graphical representation of current transfer function.

FIG. 2 shows an example graphical representation of one example current transfer function, according to the example Equation Nos. 1-4, for controlling the front bridge amplifier compensation circuit 34 and the rear bridge amplifier compensation circuit 48 to source or sink the currents Icom_front and Icom_rear to achieve the necessary values of V2 and V3. The horizontal axis 52 represents the voltage Vin relative to the voltage, where "Vin" is Vin_F for referencing the FIG. 2 characteristic to the front bridge amplifier compensation circuit 34, and is Vin_R for referencing the FIG. 2 characteristic to the rear bridge amplifier compensation circuit 48.

The vertical axis 54 represents the Icom current with respect to Vin, where "Icom" represents the Icom_front current when referencing FIG. 2 characteristic to the front bridge amplifier compensation circuit 34, and represents the Icom_rear current when referencing FIG. 2 characteristic to the rear bridge amplifier compensation circuit 48.

Referring to FIGS. 1 and 2, Equation Nos. 1 and 2 apply for the Vin voltage band between points 56 and 58 on FIG. 2, which is the band between negative Vmax/2 and positive Vmax/2. These are the voltages at which mode switch 16 is closed. If Vin is above Vmax/2 or below negative Vmax/2m the mode switch 16 is open. For Vin voltages ranging from negative Vmax/2 to negative Vmax, Equation Nos. 3 and 4 apply, whereupon Icom decreases until Vmas is reached. If Vin goes below Vmax the voltage across at least one of the front and rear speakers will clip. Similarly, for Vin voltages ranging from positive Vmax/2 to positive Vmax Equation Nos. 3 and 4 also apply, and Icom decreases until Vmax is reached, beyond which the amplifier dips. If Vin goes above Vmax, the voltage across at least one of the front and rear speakers will clip.

It should be understood that the equations and relating description may have a minor approximation, because the gain of the outer differential amplifiers 22 and 36, in terms of their respective voltage out over voltage in, is:

$$\frac{V_{out}}{V_{in}} = 1 + \frac{R2}{R1}, \quad \text{(Eqn. 5)}$$

whereas the gain for the common mode injected signal at the tail is:

$$\frac{V_{out}}{V_{commontail}} = -\frac{R2}{R1} \quad \text{(Eqn. 6)}$$

The previous descriptions, referencing the partial model of FIG. 1, describe generating V2 and V3 to be equal when the mode switch 16 is closed. However, regardless of the technology used for the mode switch 16, there is a resistance value, labelled on FIG. 1 as Rswitch.

Therefore, for actual implementations, V2 and V3 must have a difference equal to the current passing through the mode switch 16 multiplied by Rswitch. If this difference is not provided, the current cannot flow. Further, if V2 and V3 are set to correspond to the voltage drop across the mode switch 16 then, as discovered by the present inventors, the currents sourced or sunk by the inner differential amplifiers 18 and 20 will have the same magnitude, and be in the same direction. Based on this information, the following two example means may be used to control V2 and V3.

The first is a feedforward control such as, for example, calculating the required V2 and V3 and feeding this forward, for example, to the inner differential amplifiers 18 and 20. The second is a feedback control, implemented by, for example, detecting the current output (or sunk) by each of the inner differential amplifiers 18 and 20 and, based on the detected difference, source or sink an additional compensation current to the front common node 33 and the rear common node 47.

FIG. 3 shows one example dual bridge switched SB amplifier according to one or more embodiments, having one example implementation of an exemplary switch voltage control circuit according to one feedback-type switch voltage control aspect for controlling V2 and V3 as previously described. It will be understood that the FIG. 3 example is depicted as a modification of the FIG. 1 partial model and, therefore, like components and features are labelled with like reference numbers.

Referring to FIG. 3, for maximum efficiency, zero current should flow between the inner differential amplifiers 18 and 20 because, if this condition can be guaranteed, the current that is able to be shared between the front and the rear speakers 24, 28 will flow through the mode switch 16. One example means to guarantee the above-described condition is to measure the output currents of the inner differential amplifiers 18 and 20. Such measurement can be done by means of, for example, a scaled duplicate of these output currents.

The common amplifier 62, based on detecting the currents 64 and 66 of the inner differential amplifiers 18 and 20, outputs currents 68R and 68F, which forces the amplifiers' respective output currents to flow in the same direction, because current will flow through the mode switch 16 due to the change in the common mode voltages V2 and V3.

This solution provides various significant benefits and advantages. One from among these benefits and advantages is that the differential amplifiers 18, 20, 22, and 36 operate in normal mode, reducing the distortion because V1 and V4 are compensated for the voltage across the mode switch 16.

Another from among these benefits and advantages is that the differential amplifiers 18, 20, 22, and 36 no longer need to be switched, so there is no additional switching distortion.

Still another from among the various advantages and features is that the resistance of the amplifiers remains low because the loads, e.g., the front load 24 and rear load 28 are voltage driven. Resistance of the mode switch 16 is not located in the signal path.

The additional control loop 62, 64, 66, 68F and 68R, only affects the common mode voltages because it is not in the signal path and, as previously described, the control loop also compensates for inaccuracy of the compensation currents Icom_front and Icom_rear generated by the front and rear compensation current sources 34 and 48.

According to one or more exemplary embodiments, the voltage V2 and V3 may be made adaptive such that a dual mode class SB amplifier according to one or more embodiments may be maintained in the series amplification mode for a higher percentage of time, or at a higher statistical probability. According to one aspect, this feature is obtained by adapting the common mode output voltage, i.e., V2 and V3 in the depicted example, to both of the input signals Vin_F and VinR. One example implementation according to this one aspect is to modify the FIG. 3 version, as well as its included partial model, by applying different common currents at the tails than described by Equation Nos. 1-4 and depicted at FIG. 2. According to one aspect, the following equations may be used to generate the Icomp_front and Icomp_rear currents:

$$\text{Icom\_front} = \frac{-V'_{in\_R}}{R1} \quad \text{(Eqn. 7)}$$

$$\text{Icom\_rear} = \frac{-V'_{in\_F}}{R1} \quad \text{(Eqn. 8)}$$

The voltages V2 and V3 are then forced to be equal to:

$$\frac{V2}{Gain_{comm}} = -\frac{1}{2}V_{IN\_F} - \frac{1}{2}V'_{In\_R} \quad \text{(Eqn. 9)}$$

$$\frac{V3}{Gain_{comm}} = -\frac{1}{2}V_{IN\_R} - \frac{1}{2}V'_{In\_F} \quad \text{(Eqn. 10)}$$

The result is that V2 and V3 are equal to one another but, instead of being Vdd/2, they are the average of Vin_F and Vin_R, subject to the following condition:

$$V'_{in\_F} = V_{in\_F} \text{ whereas } |V'_{in\_F}| \text{ is limited to } |V_{in\_max} - V_{in\_R}| \quad (11)$$

$$V'_{in\_R} = V_{in\_R} \text{ whereas } |V'_{in\_R}| \text{ is limited to } |V_{in\_max} - V_{in\_F}| \quad (12)$$

The generated Icom_front and Icom_rear currents are feedforward currents, which are generated in relation to Vin as shown in FIG. 2.

In FIG. 3, the amplifier Gm5 is an additional feedback control needed to keep currents from Gm2 and Gm3 flowing in the same direction. In this way, the shared signal current is forced through the switch. This means a current will flow through the switch due to a common mode offset between two the BTL amplifiers.

Thus, in the circuit of FIG. 3, based on the input signals Vin_F and Vin_R both common mode currents Icom_front and Icom_rear are generated such that the outputs V2 and V3 are constant at half supply and the switch is dosed. When the voltage over the load cannot be accommodated within the supply range, the switch is opened and the common mode currents are reduced until the outputs of the BTL stage is fully dipping.

In order to simplify system stability, generation of the common mode tail currents and control of the switch is based on the value of the input-signals Vin_F and Vin_R, thus using a feed-forward approach.

The current is derived that must be applied to the tail of the bridge tied load in order to keep V2 and V3 constant.

During non-clipping conditions, the above described system works as desired. However, clipping of one of the output stages of any of the amplifiers Gm1 to Gm4 will introduce a delay in the corresponding output stage.

Now the condition occurs that based on the information of the input signal (using the feed-forward control) the system decides to close the switch between stages Gm2 and Gm3 while, due to the delay, they are still at either supply or ground. The maximum cross-current is in the range of Vsupply/(Rswitch+RON,gm2+RON,gm3).

Since the typical switch resistance is in the range of ohms, (for example around 0.1 Ohm) the current is mainly determined by the value of Rswitch. This means that given a certain switch resistance, cross-currents will be increase for increasing values of Vsupply.

Figure 4:
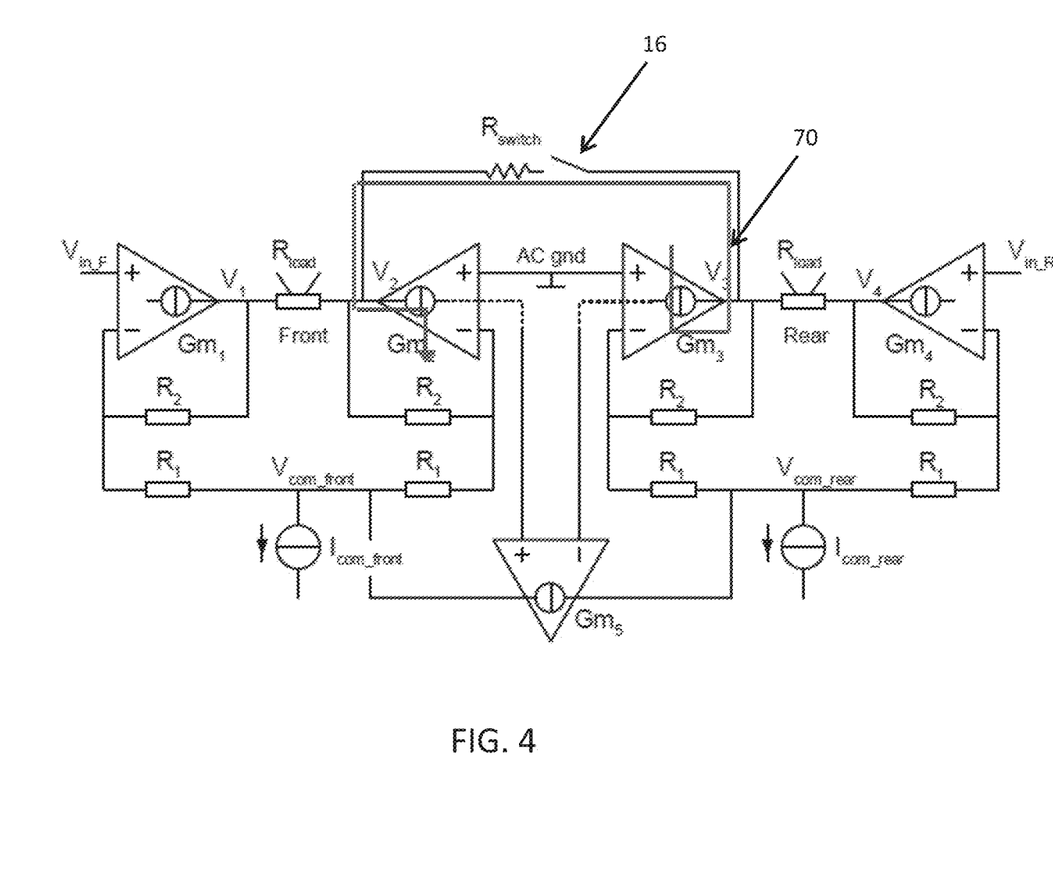
FIG. 4 shows an example of two dipping BTL amplifiers where the output of Gm2 is at ground level and the output of Gm3 is at supply voltage level, and a large cross current is generated.

FIG. 4 shows an example of two dipping BTL amplifiers where the output of Gm2 is at ground level and the output of Gm3 is at supply voltage level. When based on the input signals the system decides to dose the switch based on the feed-forward control, this results in a large cross current as shown by the arrow 70.

A problem thus arises that during clipping conditions, the amplifier operates in bridge tied load mode and the outputs of a BTL half are either at supply or ground and the switch is open. When the input voltages change, the outputs introduce a certain delay.

Figures 5, 6:
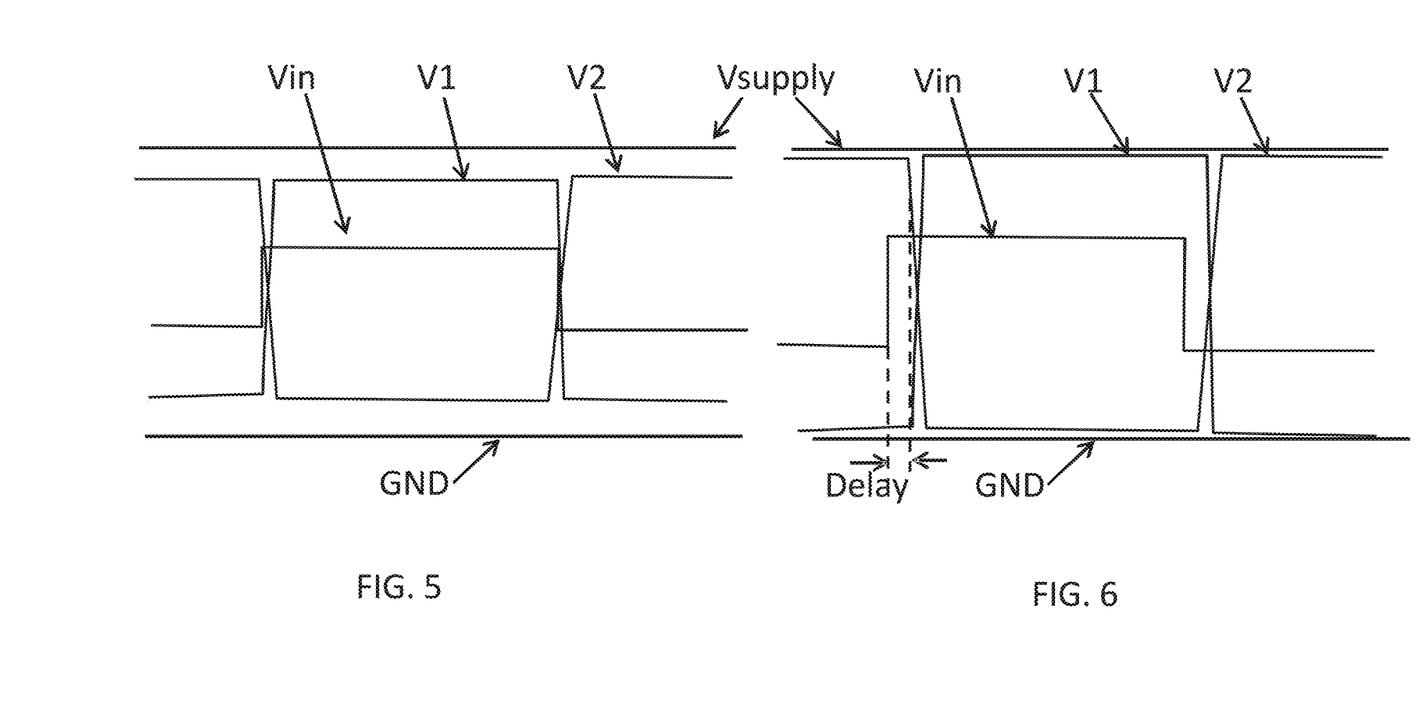
FIG. 5 shows the signals of the known bridge tied load channel.
FIG. 6 shows the delay introduced when a BTL channel is dipping.

FIG. 5 shows the signals of a non-clipping BTL channel and FIG. 6 shows the delay introduced when a BTL channel is clipping. As shown schematically, the signals in FIG. 6 are larger to represent clipping. The delay following an input voltage change is shown in FIG. 6.

From FIGS. 5 and 6, it can be seen that, based on a feed-forward principle, the system decides to close the switch too early while the full supply voltage is still over the switch. This results in large cross currents running through the switch which are sinkedisources by amplifiers Gm2/Gm3.

The invention aims to prevent large currents in the system caused by the delay introduced in the output stages resulting from the feed forward based control of the switch.

The benefits of preventing large cross-currents are:

no audio holes due to fact the high currents trigger the device current protection;

no damage to the power stages and switch due to electrical overstress conditions;

no latch-up which can occur in non-SOI based process;

high cross currents can be avoided by preventing closing of the mode switch at a too early stage;

The invention is based on detecting if the outputs are still clipping, and then preventing the mode switch from being dosed.

Clipping of the outputs can be detected in following ways:

detection if the amplifier loop is out-of-regulation by measuring the system error signal;

measurement of the voltage over the switch in relation to the supply voltage;

measurement of the voltage of the output with respect to ground or supply voltage;

An example will be shown based on the third approach above for detecting clipping. This can be the most simple to implement in an already existing design.

Figure 7:
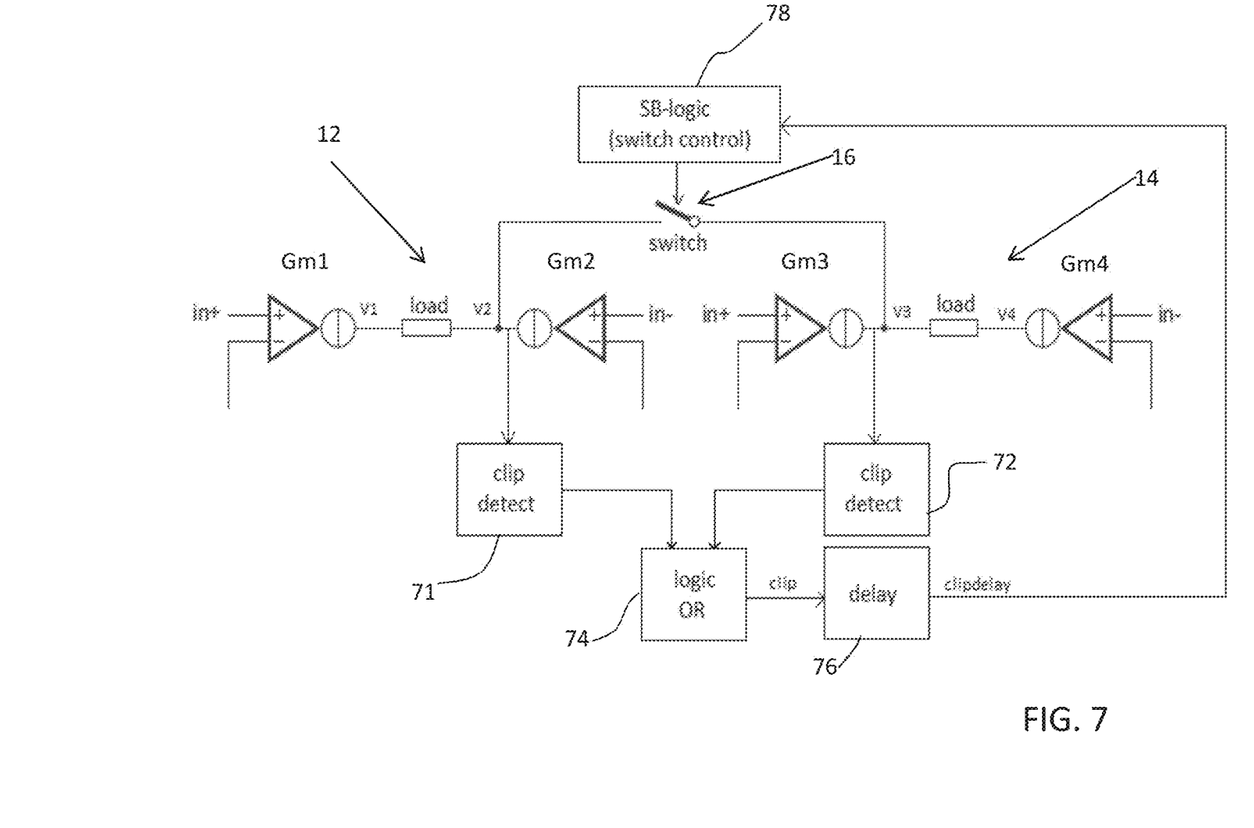
FIG. 7 shows a circuit in accordance with the invention.

The circuit is shown in FIG. 7. Only the relevant parts of the known circuit of FIG. 1 are shown (the four amplifiers Gm1 to Gm4, the mode switch and the two loads).

A clip detection circuit comprises two clip detection units 71,72 for detecting if the outputs connected to the switch (nodes V2 and V3) are clipping.

The two clip detectors 71,72 detect high-side and low-side clipping of the outputs connected to the switch. The clip detect signals are combined with a logic OR gate 74 and then a delay is added by delay unit 76. The delay is added to introduce filtering of glitches and to add a safety margin before closing the mode switch after the output recovers from clipping.

As long as a clipping condition is detected (clip is high) and the output of the delay (clipdelay) is high, the mode switch control logic 78 ("SB-logic") is prevented from closing the mode switch.

To ensure clipping is always detected, the threshold levels of the clip detect circuits 71,72 should be such that they are above the worst-case voltage drop over the power transistor during all use-case conditions (such as high temp, high current, process spread).

For audio applications, the timing of the delay filter is in of order of a few micro-seconds, such as between 1 and 10 microseconds. A 20 kHz maximum frequency for an audio signal corresponds to a period of 50 microseconds. Timing considerations are that the delay should be low enough to guarantee no interference in the worst-case operating conditions. The system is designed using soft-switching to improve total harmonic distortion ("THD") performance. When the switch closes too late, it can cause abrupt switching compromising THD.

The delay should also be high enough to allow some filtering for glitches and have sufficient safety margin.

Increasing the delay time reduces cross currents when coming out of dipping.

Figure 8:
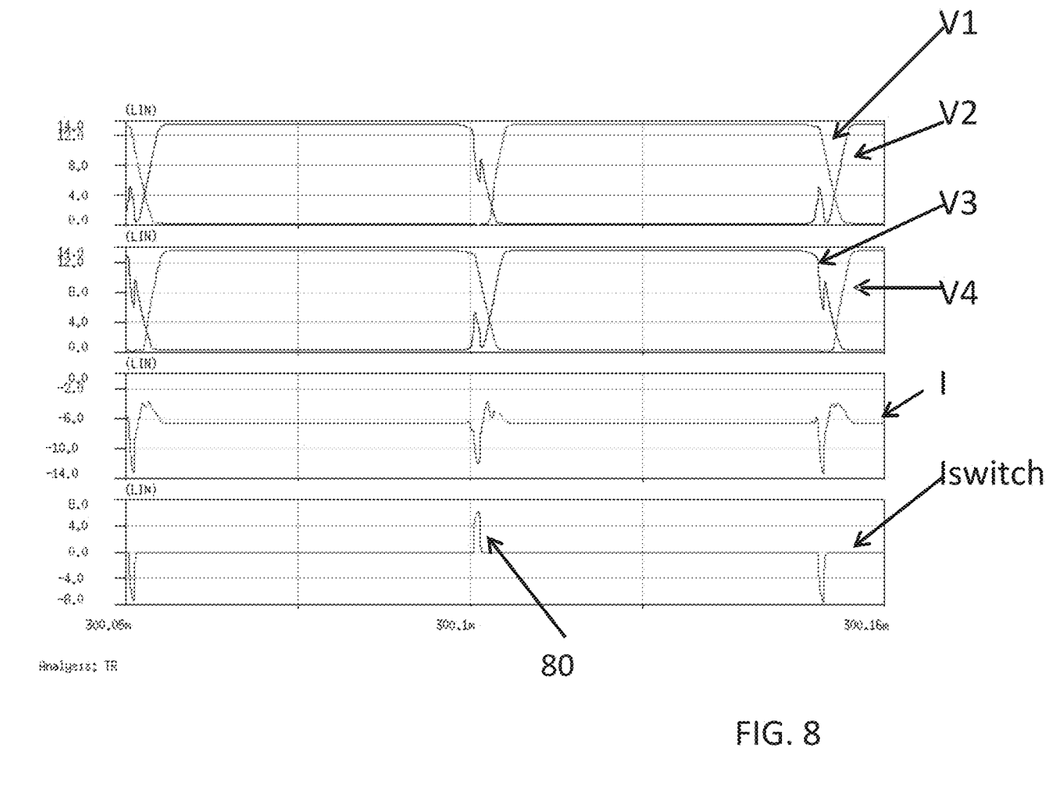
FIG. 8 shows simulation results of a Class-SB configuration without the improvement of the invention.

FIG. 8 shows simulation results of a Class-SB configuration without the improvement of the invention, during a dipping condition at a typical supply voltage of 14.4V.

The top two plots show the two pairs of differential outputs V1,V2 and V3,V4. The third plot shows the current I which is the total supply current for one bridge loaded with a 4 Ohm load. Since the supply voltage is 14.4V, and there is about 0.4V voltage drop over power devices, the supply current during clipping is ~2*14V/4Ω=7A. During the transitions the large cross-current is superimposed on the supply current.

The fourth plot shows the current flowing through the mode switch Iswitch.

A high cross-current spike 80 can be seen of more than 6 A through the switch at the moment the full supply-voltage is over the switch. This cross current is superimposed on the already high supply current. The switch shorts V2 and V3 causing them to be forced to one another.

Figure 9:
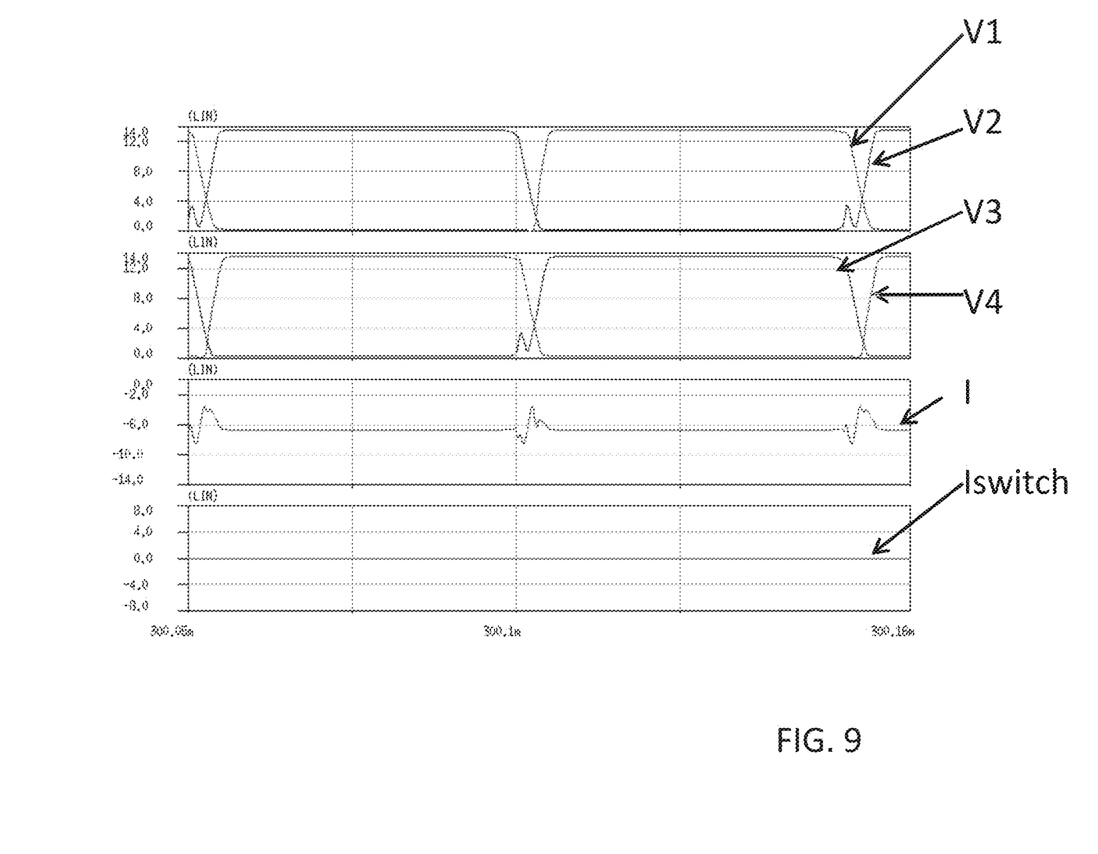
FIG. 9 shows the same simulation as FIG. 8 but using the circuit of FIG. 3.

FIG. 9 shows the same simulation but using the circuit of FIG. 3. No large cross-currents through the mode switch are present.

Figure 10:
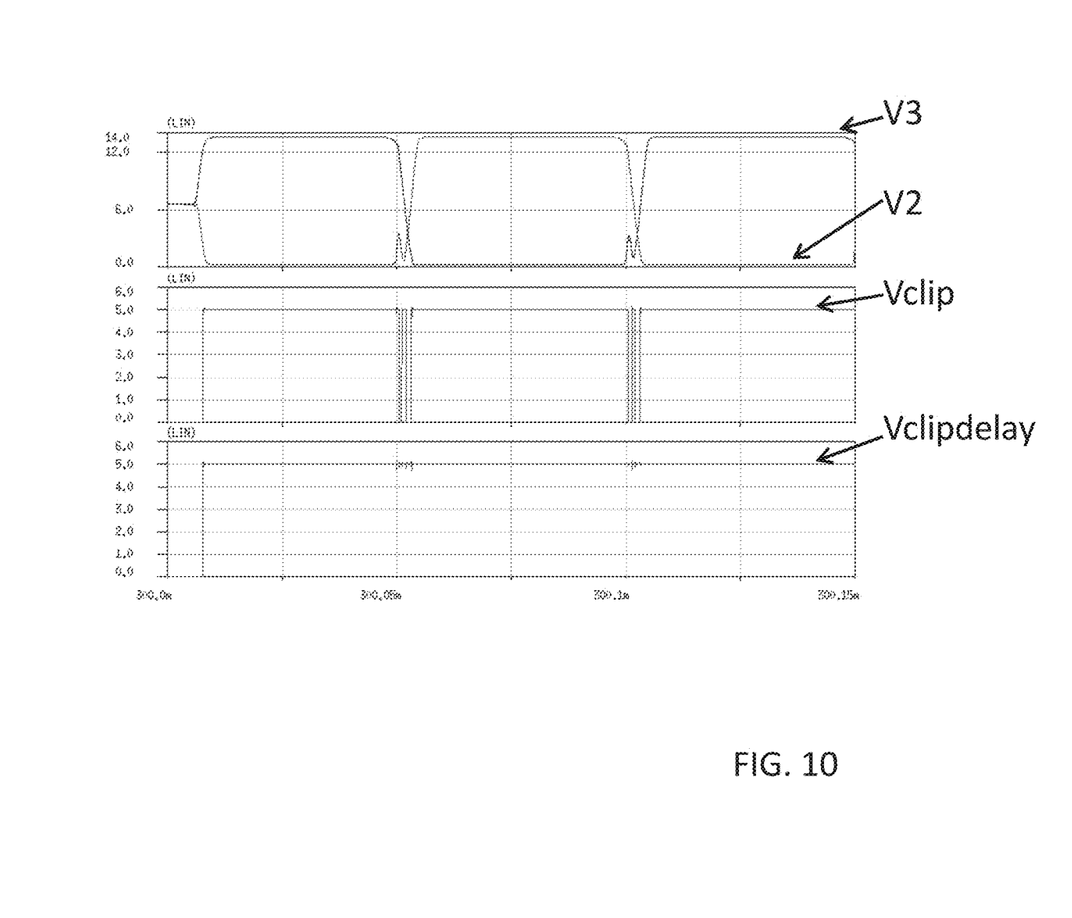
FIG. 10 shows the voltages at the mode switch.

FIG. 10 shows the voltages at the mode switch (V2 and V3). When the output clips, the voltage Vclip at the output of the OR gate 54 goes high. This signal is delayed by the delay 76 to generate the voltage Vcipdelay. The voltage Vclipdelay is provided to the control logic 78 and as long as Vclipdelay is high the switch is prevented from being closed.

The invention can be used in audio amplifiers such as automotive audio amplifiers using the Class-SB high efficiency principle. The amplifier is a high efficiency quad class-AB amplifier with full diagnostics.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or an does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An amplifier comprising:
    a first bridge amplifier section having two differential amplifiers with a first load connected between their outputs;
    a second bridge amplifier section having two differential amplifiers with a second load connected between their outputs;
    a mode switch between a first output of one differential amplifier of the first bridge amplifier section and a second output of one differential amplifier of the second bridge amplifier section;
    a control circuit, coupled to the mode switch, and configured to control the mode switch based on a set of input signals to the first and second bridge amplifier sections;
    a clip detection circuit configured to detect clipping in the first or second outputs; and
    a delay circuit, coupled to the clip detection circuit and the control circuit, and configured to provide a delay period in response to the detected clipping, wherein the control circuit is configured to inhibit closing of the mode switch during the delay period.

2. An amplifier as claimed in claim 1, comprising an audio amplifier.

3. An amplifier as claimed in claim 1, comprising a first current source tail for the first bridge amplifier section and a second current source tail for the second bridge amplifier section.

4. An amplifier as claimed in claim 3, comprising an amplifier which detects currents of an output differential amplifier of the first bridge amplifier section and an output differential amplifier of the second bridge amplifier for generating output currents which force the output differential amplifier output currents to flow in the same direction.

5. An amplifier as claimed in claim 1, wherein the clip detection circuit comprises means for measuring a voltage of the output with respect to ground or a supply voltage.

6. An amplifier as claimed in claim 1, wherein the clip detection circuit is adapted to detect high-side and low-side clipping of the signals at each side of the mode switch.

7. An amplifier as claimed in claim 6, further comprising a logic OR gate for combining the clipping signals at each side of the mode switch and providing the combined signal to the delay circuit.

8. An amplifier as claimed in claim 1, wherein the delay period has a value of 1 to 10 microseconds.

9. A loudspeaker circuit comprising an amplifier as claimed in claim 1, a first loudspeaker which comprises the first load, and a second loudspeaker which comprises the second load.

10. A method of controlling an amplifier, the amplifier comprising:
    a first bridge amplifier section having two differential amplifiers with a first load connected between their outputs;
    a second bridge amplifier section having two differential amplifiers with a second load connected between their outputs; and
    a mode switch between a first output of one differential amplifier of the first bridge amplifier section and a second output of one differential amplifier of the second bridge amplifier section,
    wherein the method comprises:
        controlling the mode switch based on a set of input signals to the first and second bridge amplifier sections;
        detecting clipping in the first or second outputs; and
        inhibiting closing of the mode switch during a delay period in response to the detected clipping.

11. A method as claimed in claim 10, comprising detecting currents of an output differential amplifier of the first bridge amplifier section and an output differential amplifier of the second bridge amplifier, thereby to generate output currents which force the output differential amplifier output currents to flow in the same direction.

12. A method as claimed in claim 10 wherein detecting clipping comprises measuring a voltage of the output with respect to ground or a supply voltage.

13. A method as claimed in claim 10, wherein detecting clipping comprises detecting high-side and low-side clipping of the signals at each side of the mode switch.

14. A method as claimed in claim 10, wherein the delay period has a value of 1 to 10 microseconds.

15. A method as claimed in claim 10 for driving a first loudspeaker which comprises the first load, and a second loudspeaker which comprises the second load.

* * * * *